(12) United States Patent  (10) Patent No.: US 7,759,202 B2
Lin et al.  (45) Date of Patent: Jul. 20, 2010

(54) METHOD FOR FORMING SEMICONDUCTOR DEVICE WITH GATES OF DIFFERENT MATERIALS

(75) Inventors: Chien-Ting Lin, Hsin-Chu (TW); Li-Wei Cheng, Hsin-Chu (TW); Che-Hua Hsu, Hsin-Chu Hsien (TW); Yao-Tsung Huang, Kaohsiung County (TW); Guang-Hwa Ma, Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/198,111

(22) Filed: Aug. 25, 2008

(65) Prior Publication Data

US 2008/0318371 A1  Dec. 25, 2008

Related U.S. Application Data

(62) Division of application No. 11/743,650, filed on May 2, 2007.

(51) Int. Cl.
*H01L 21/8234* (2006.01)
*H01L 21/44* (2006.01)

(52) U.S. Cl. .................. 438/275; 438/581; 438/583; 438/655; 257/E21.622

(58) Field of Classification Search ................ 438/275, 438/581, 583, 655; 257/E21.622
See application file for complete search history.

(56) References Cited

U.S. PATENT DOCUMENTS 6,492,688 B1  12/2002  Ilg
7,074,664 B1  7/2006  White
7,354,855 B2  4/2008  Hotta
7,396,764 B2  7/2008  Komori
7,405,112 B2  7/2008  Besser
2002/0130393 A1* 9/2002 Takayanagi et al. ......... 257/616
2005/0048725 A1  3/2005  Shibahara
2005/0095763 A1  5/2005  Samavedam
2005/0106788 A1* 5/2005 Amos et al. ................. 438/152
2005/0116230 A1  6/2005  Cabral, Jr.
2005/0275035 A1  12/2005  Mathew
2007/0063308 A1* 3/2007 Van Der Meer et al. ..... 257/506
2007/0138563 A1* 6/2007 Callegari et al. ............ 257/369
2007/0152276 A1* 7/2007 Arnold et al. ................ 257/369
2007/0215956 A1* 9/2007 Tsuchiya et al. ............ 257/407
2008/0029822 A1* 2/2008 Tsuchiya et al. ............ 257/369
2008/0157212 A1  7/2008  Lavoie
2008/0254581 A1  10/2008  Koyama
2008/0254616 A1  10/2008  Hotta
2009/0152642 A1* 6/2009 Bojarczuk et al. ........... 257/369
2009/0283830 A1* 11/2009 Callegari et al. ............ 257/351
2009/0302389 A1* 12/2009 Lander et al. ............... 257/369

FOREIGN PATENT DOCUMENTS

CN  1893002 A  1/2007

\* cited by examiner

*Primary Examiner*—Ngan Ngo
(74) *Attorney, Agent, or Firm*—Winston Hsu

(57) ABSTRACT

A semiconductor device includes a first gate structure including a gate dielectric layer directly contacting the substrate, a bottom electrode on the gate dielectric layer and a top electrode on the bottom electrode, and a second gate structure including a gate dielectric layer directly contacting the substrate and a gate electrode on the gate dielectric layer.

22 Claims, 8 Drawing Sheets

METHOD FOR FORMING SEMICONDUCTOR DEVICE WITH GATES OF DIFFERENT MATERIALS

CROSS REFERENCE TO RELATED APPLICATIONS

This patent application is a divisional application of and claims priority to U.S. patent application Ser. No. 11/743,650, filed on May 2, 2007, and entitled "SEMICONDUCTOR DEVICE AND METHOD OF FORMING THE SAME," the entire contents of which are incorporated herein by reference.

BACKGROUND OF THE INVENTION

1. Field of the Invention

The present invention relates to a semiconductor device and the method for forming the same. More particularly, the present invention relates to a semiconductor device with two different MOS structures.

2. Description of the Prior Art

Metal-oxide-semiconductor field-effect transistor, MOSFET for short, is a widely used field-effect transistor. According to the polarity of its channel, the MOSFET is divided into the P-type and the N-Type, i.e. PMOS and NMOS.

Functionally speaking, PMOS and NMOS each has different threshold voltages, which are determined by the difference of the work function of the gate and the channel material. This can be accomplished by two different metals as the gate materials.

Because two layers of different metals are required to be the gate material, conventionally the two layers are formed respectively. For example, U.S. Pat. No. 7,074,664 discloses that firstly a first gate electrode material layer is entirely formed on a substrate, later a selective etching is performed based on a well defined patterned hard mask, then a second gate electrode material layer fills the space caused by the selective etching, finally the surfaces of the first gate electrode material layer and the second gate electrode material layer are planarized to complete the fabrication.

In U.S. patent publication 2005/095763, it discloses that a sacrificial layer is entirely formed on a substrate, later the sacrificial layer is selectively removed to be filled with a first gate electrode material layer, then the sacrificial layer is completely removed to be filled with a second gate electrode material layer to complete the fabrication.

No matter which fashion is used, a selective etching must be performed to form different metal layers for respectively deciding the threshold voltages of the PMOS and NMOS. It is clear that the concept of forming the first gate electrode material layer first and followed by the etching to form the second gate electrode is both complex and troublesome and does not meet the demand of simplicity pursued by the industry.

Therefore, it is necessary to provide a simple and convenient method for forming a PMOS and an NMOS with different threshold voltages.

SUMMARY OF THE INVENTION

In one aspect the present invention provides a semiconductor device with a PMOS and an NMOS, in one of which, one conductive material stacks on another one on a substrate to form a composite gate electrode and the other one has only one conductive material to form a single electrode. Preferably, of the conductive materials of the PMOS and the NMOS neighboring the substrate, one has the work function higher than the substrate's and the other one has a lower one to provide the different threshold voltages required by the PMOS and the NMOS.

The semiconductor device of the present invention includes a substrate, on the substrate a first gate structure including a gate dielectric directly contacting the substrate, a lower electrode on the gate dielectric and an upper electrode on the lower electrode, a first source/drain in the proximity of the first gate structure, on the substrate a second gate structure including the gate dielectric directly contacting the substrate and a gate electrode on the gate dielectric, a second source/drain in the proximity of the second gate structure and an interlayer dielectric layer covering the substrate, the first gate structure, the first source/drain, the second gate structure and the second source/drain.

The first gate structure includes a lower electrode and an upper electrode, each one is comprised of a conductive material different from the other. The lower electrode on the gate dielectric is in charge of controlling the threshold voltage of such MOS. The second gate structure which is of similar or the same material solely includes one gate electrode for controlling the threshold voltage, to be distinguished from that of the first gate structure, controlled by the lower electrode.

In another aspect the present invention provides a method for forming a semiconductor device. The method includes first providing a substrate with an oxide layer on its surface, later forming a lower electrode layer on the oxide layer and selectively exposing part of the oxide layer, afterwards depositing a silicon layer to cover the lower electrode layer and the oxide layer, then forming a barrier layer on the silicon layer, following etching the barrier layer, the silicon layer, the lower electrode layer and the oxide layer to selectively expose the substrate, later forming a first gate structure and a second gate structure, wherein the first gate structure includes the silicon layer, the lower electrode layer and the oxide layer and the second gate structure includes the oxide layer and the silicon layer directly contacting the oxide layer, then forming a first source/drain in the proximity of the first gate structure and a second source/drain in the proximity of the second gate structure in the exposed substrate, and forming a gate electrode layer by reacting the silicon layers with a metal.

In the method of the present invention, only the lower electrode layer is selectively formed. The following silicon layer may entirely cover the lower electrode layer. In the method of the present invention, it is neither required to selectively etch the lower electrode layer nor to planarize the separately formed lower electrode layer and the silicon layer to the same surface, rather to primarily form a silicide layer made from the silicon layer. Obviously many complicated steps are omitted and this is a simple and easy approach. The advantages of the present invention reside in that the threshold voltages of each gate structure are determined by ingeniously taking the advantages of the difference of the work function between the silicide layer formed by the silicon layer and a metal and the lower electrode layer. Preferably, of the silicide layer and the lower electrode layer respectively in the two separate gate structures, one has the work function higher than the substrate's and the other one has a lower one. This is a simple and easy way to form the PMOS and the NMOS with different threshold voltages and to meet the demand of a more simplified process.

These and other objectives of the present invention will no doubt become obvious to those of ordinary skill in the art after reading the following detailed description of the preferred embodiment that is illustrated in the various figures and drawings.

DETAILED DESCRIPTION

The present invention first provides a semiconductor device which includes a PMOS and an NMOS. In one of which, one conductive material stacks on another one on the gate dielectric of the substrate to form a composite gate electrode and the other has only one conductive material to form a single electrode. Preferably, of the two conductive materials, one has the work function higher than the substrate's and the other one has a lower one to provide the different threshold voltages required by the PMOS and the NMOS.

Figure 1:
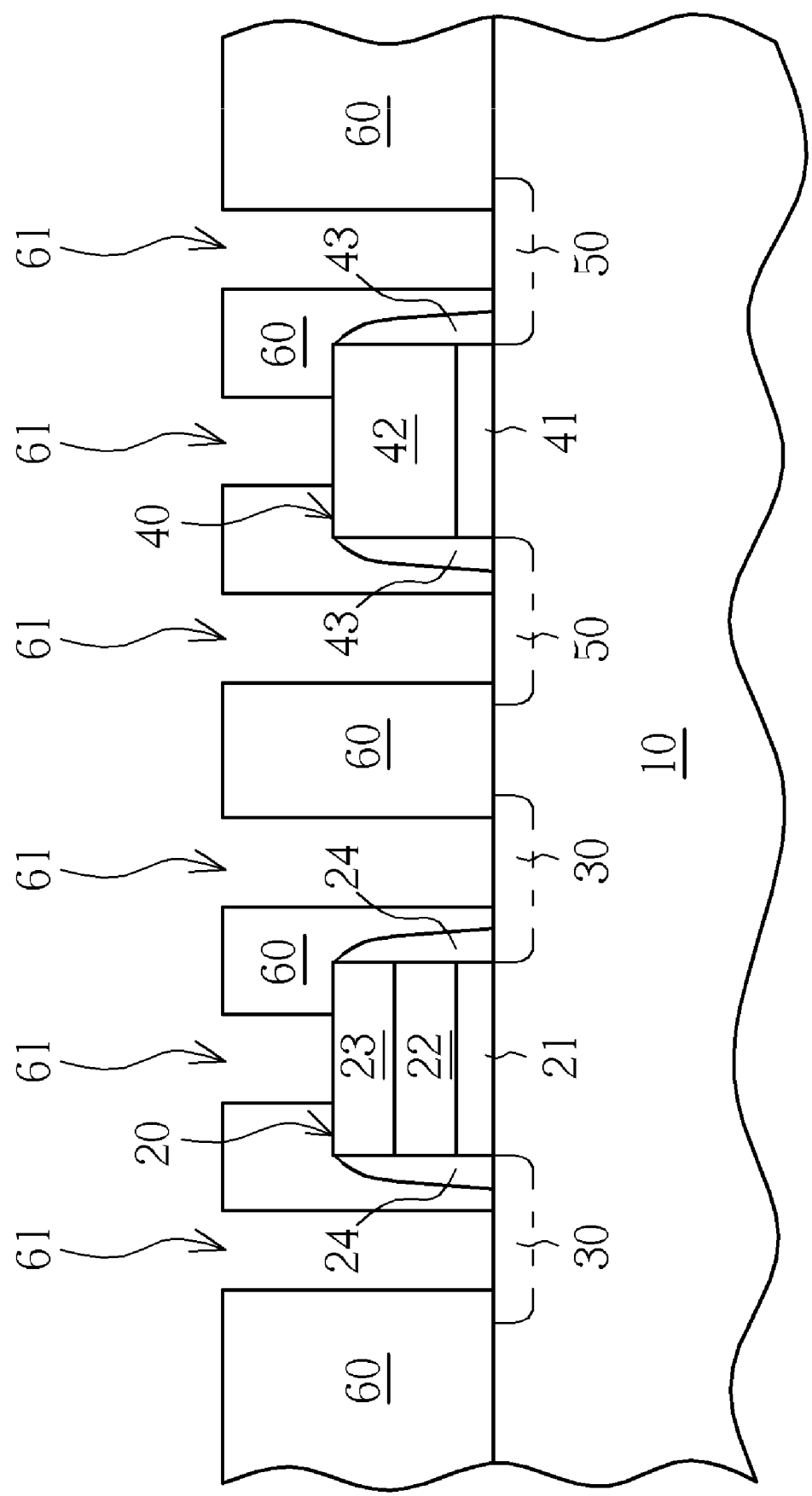
FIG. 1 illustrates a preferred embodiment of the semiconductor device of the present invention.
Figure 2:
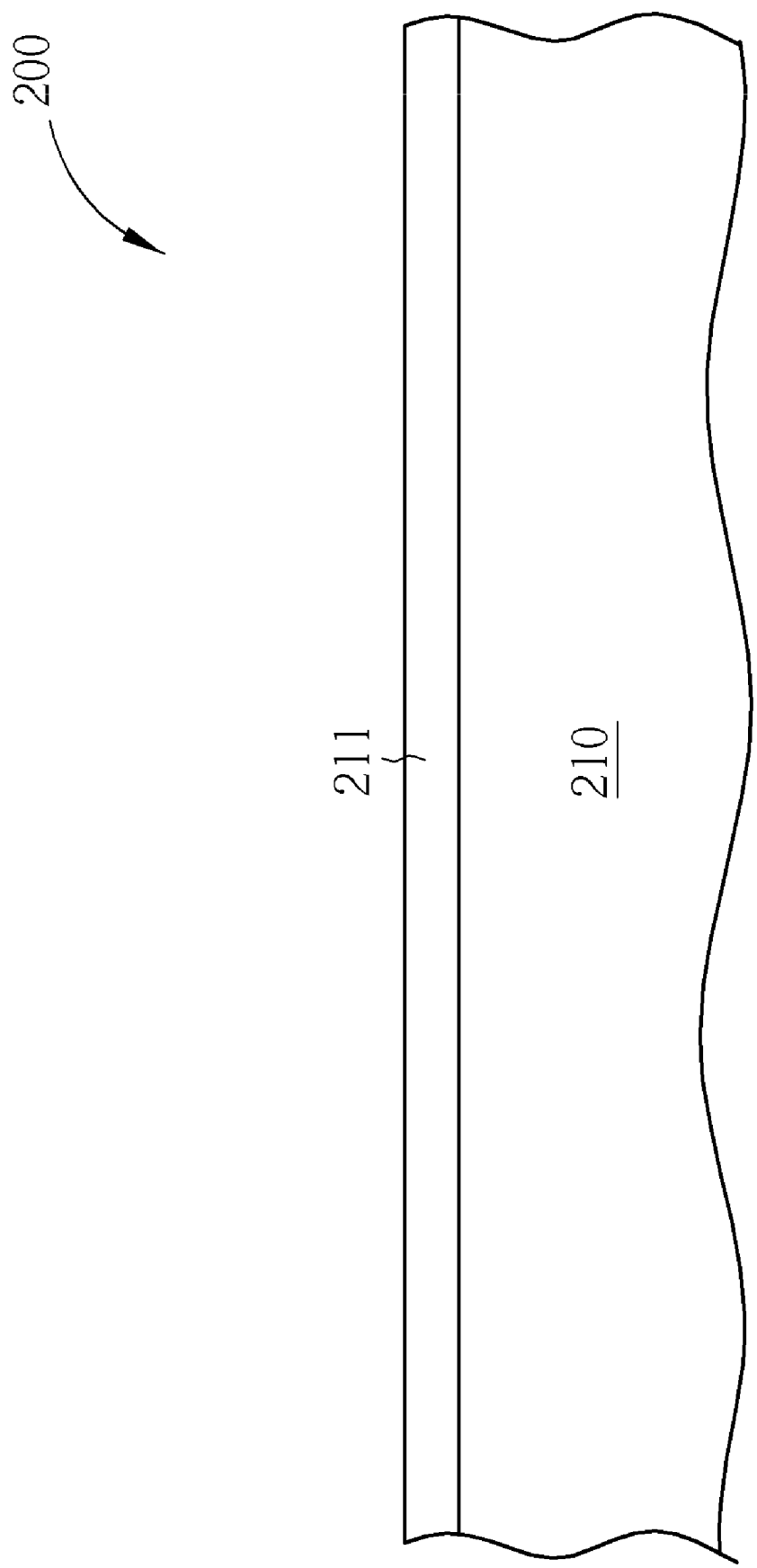
FIG. 2 to FIG. 8 illustrate the method for forming the semiconductor device of the present invention.

FIG. 1 illustrates a preferred embodiment of the semiconductor device of the present invention. Please refer to FIG. 1, the semiconductor device 1 of the present invention includes the substrate 10, the first gate structure 20, the first source/drain 30, the second gate structure 40, the second source/drain 50 and the interlayer dielectric 60 covering the substrate 10, the first gate structure 20, the first source/drain 30, the second gate structure 40 and the second source/drain 50. The substrate 10 may be a semiconductor substrate, such as silicon, direct-silicon bonding (DSB), silicon on insulator (SOI) and silicon on insulator direct-silicon bonding (SOIDSB), but is not limited to these.

The first gate structure 20 on the substrate 10 includes a gate dielectric 21, a lower electrode 22 and an upper electrode 23. The second gate structure 40 on the substrate 10 includes a gate dielectric 41 directly contacting the substrate 10 and a gate electrode 42 on the gate dielectric 41. The lower electrode 22 is directly disposed on the gate dielectric 21 and the upper electrode 23 is directly on the lower electrode 22.

The first gate structure 20 and the second gate structure 40 may be any conventional gate structure, such as a normal gate, a FinFET or a multigate . . . etc. The gate dielectric 21/41 usually includes oxides, nitrides, oxynitrides, or high k materials such as metal oxides, silicon oxides, silicon nitrides, and silicon oxynitrides . . . etc. Preferably the lower electrode has a thickness of 10-300 Å.

The selection of the materials for the lower electrode 22 and the gate electrode 42 depends on whether the first gate structure 20 is an N-channel metal-oxide semiconductor gate structure or a P-channel metal-oxide semiconductor gate structure. For example, if the first gate structure is a P-channel metal-oxide semiconductor gate structure and the second gate structure is an N-channel metal-oxide semiconductor gate structure, the lower electrode 22 in the first gate structure may include a conductive material with a work function smaller than that of the substrate 10 and the gate electrode 42 in the second gate structure may include a conductive material with a work function higher than that of the substrate 10. For instance, if the substrate is silicon, the lower electrode 22 of the P-channel MOS in the first gate structure may include a conductive material such as titanium, titanium nitride, Co, Ni, Pt or Ir, preferably titanium nitride, due to the work function of silicon being 4.6 eV. The gate electrode 42 may include silicide, such as Ni-rich silicide Ni2Si. The upper electrode 23 may include any suitable conductive material, such as poly-Si, a metal or a silicide.

Or, if the first gate structure is an N-channel metal-oxide semiconductor gate structure and the second gate structure is a P-channel metal-oxide semiconductor gate structure, the lower electrode 22 in the first gate structure may include a conductive material with a work function higher than that of the substrate 10 and the gate electrode 42 in the second gate structure may include a conductive material with a work function smaller than that of the substrate 10. For instance, if the substrate is silicon, the lower electrode 22 may include $MC_x$, $MB_x$, $MC_xN_y$, $MB_xN_y$, $MB_xC_y$, or the combination thereof, wherein M is a metal of (III) group to (VII) group, preferably TaC. The gate electrode 42 may include silicide, such as Si-rich silicide $NiSi_2$. The upper electrode 23 may include any suitable conductive material, such as poly-Si, a metal or a silicide.

The first source/drain 30 and the second source/drain 50 of the present invention may be formed by any suitable method, so that the first source/drain 30 is in the proximity of the first gate structure 20 and the second source/drain 50 is in the proximity of the second gate structure 40, which are known by persons of ordinary skill in the art and the details will not be described. In addition, the surface of the first source/drain 30 and the second source/drain 50 may independently include a silicide, such as cobalt silicide or nickel silicide.

The interlayer dielectric 60 may include a plurality of contact holes 61 so as to expose the first gate structure 20, the first source/drain 30, the second gate structure 40 and the second source/drain 50 to form the contact plugs. The interlayer dielectric 60 may be formed by any suitable method and material.

If necessary, the semiconductor device 1 of the present invention may further include additional elements, such as a stress layer (not shown) in the proximity of the first gate structure 20 and the second gate structure 40. For example, for NMOS it may include a recess filled with SiC or a tension layer above. For PMOS it may include a recess filled with SiGe or a compression layer above.

The lower electrode in the first gate structure is in charge of controlling the threshold voltage of such MOS and in the second gate structure the sole gate electrode includes another conductive material for controlling the threshold voltage of such MOS. Two different conductive materials (the lower electrode in the first gate structure and the gate electrode in the second gate structure) therefore form the PMOS and the NMOS respectively. This semiconductor device has simple structure and is easy to be manufactured.

FIG. 2 to FIG. 8 illustrate the method for forming the semiconductor device 200 of the present invention. First, the substrate 210, which includes an oxide layer 211 on its surface as gate dielectric, is provided. The substrate 210 may be a semiconductor substrate, such as silicon, direct-silicon bonding, silicon on insulator and silicon on insulator direct silicon bonding, but is not limited to these. The oxide layer 211 may include oxides, nitrides, oxynitrides, or high k materials such as metal oxides, silicon oxides, silicon nitrides, and silicon oxynitrides.

Figure 3:
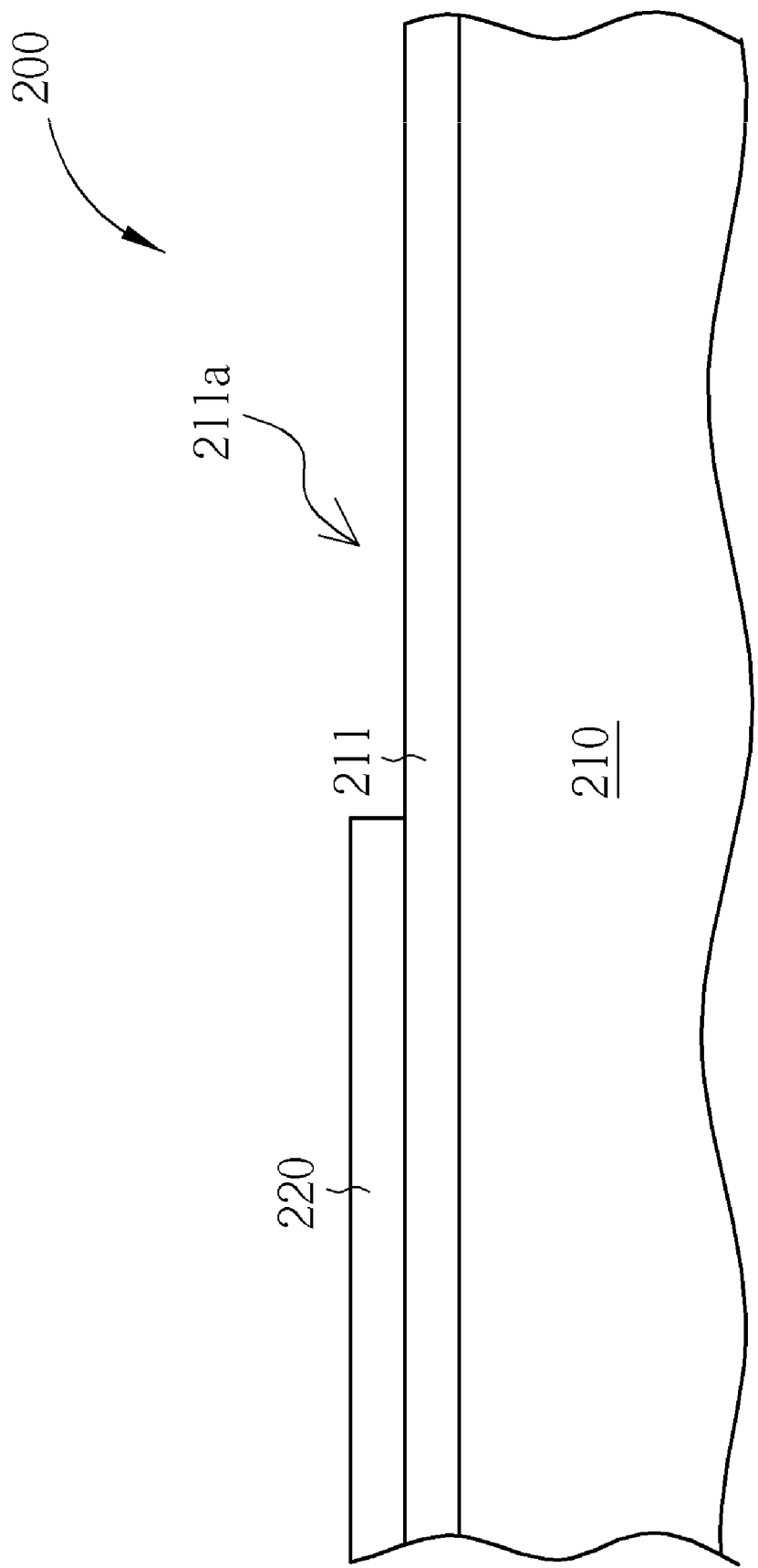

Please refer to FIG. 3. The lower electrode layer 220 is formed on the oxide layer 211 by deposition, lithography and etching method and exposes part of the oxide layer 211a selectively. The lower electrode layer 220 may have a thickness of 10-300 Å, preferably 50-100 Å. The selection of the materials for the lower electrode layer 220 depends on whether an N-channel metal-oxide semiconductor gate structure or a P-channel metal-oxide semiconductor gate structure is about to be formed. For example, if a P-channel metal-oxide semiconductor gate structure is about to be formed, the lower electrode layer 220 may include a conductive material with a work function smaller than that of the substrate 210. For instance, if the substrate is silicon, the lower electrode layer 220 may include a conductive material such as titanium, titanium nitride, Co, Ni, Pt or Ir, preferably titanium nitride, due to the work function of silicon being 4.6 eV. Or, if an N-channel metal-oxide semiconductor gate structure is about to be formed, the lower electrode layer 220 may include a conductive material with a work function higher than that of the substrate 210. For instance, if the substrate is silicon, the lower electrode layer 220 may include $MC_x$, $MB_x$, $MC_xN_y$, $MB_xN_y$, $MB_xC_y$, or the combination thereof, wherein M is a metal of (III) group to (VII) group, preferably TaC.

Figure 4:
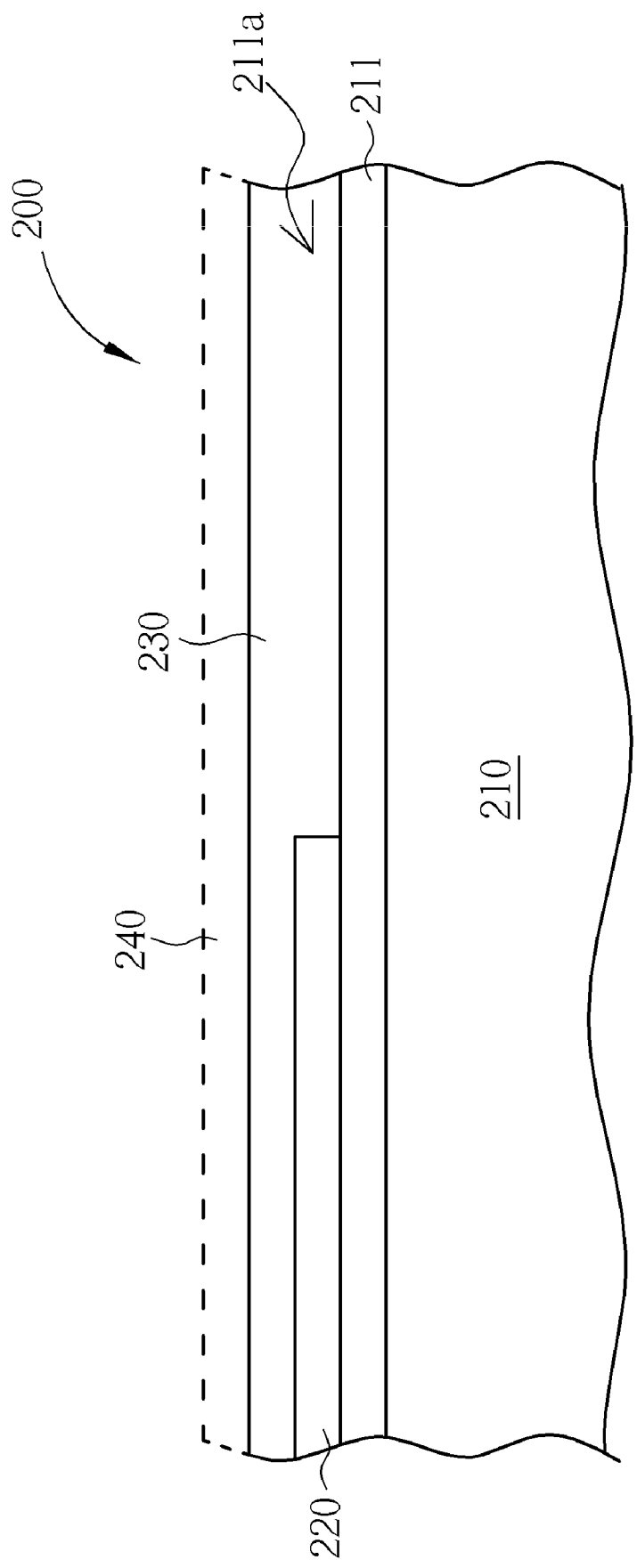

Please refer to FIG. 4. A silicon layer 230 is deposited to cover the lower electrode layer 220 and the exposed oxide layer 211a. The silicon layer 230 may preferably include poly-Si and be formed by any suitable method. A barrier layer 240 may be further formed on the silicon layer 230. The barrier layer 240 may preferably include nitrides as a cap layer for the following gate structure.

Figure 5:
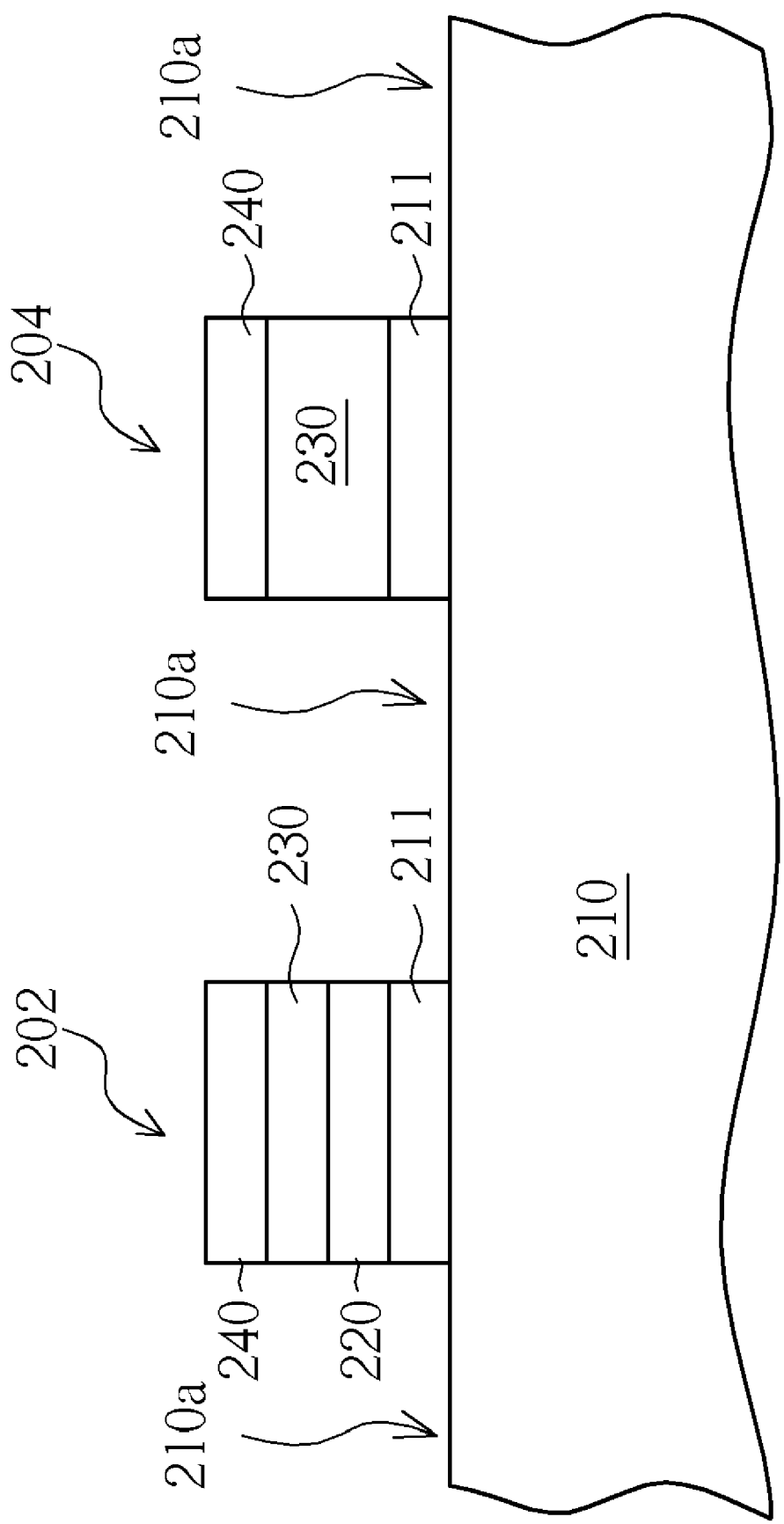

Please refer to FIG. 5. Now the barrier layer 240, the silicon layer 230, the lower electrode layer 220 and the oxide layer 210 are etched to selectively expose part of the substrate 210a to accomplish the preliminary structure of the first gate structure 202 and the second gate structure 204. The first gate structure 202 and the second gate structure 204 may be any conventional gate structure, such as a normal gate, a FinFET or a multigate. A patterned mask (not shown), such as a patterned photoresist, may be useful in assisting etching and forming the profile of the first gate structure 202 and the second gate structure 204.

Figure 6:
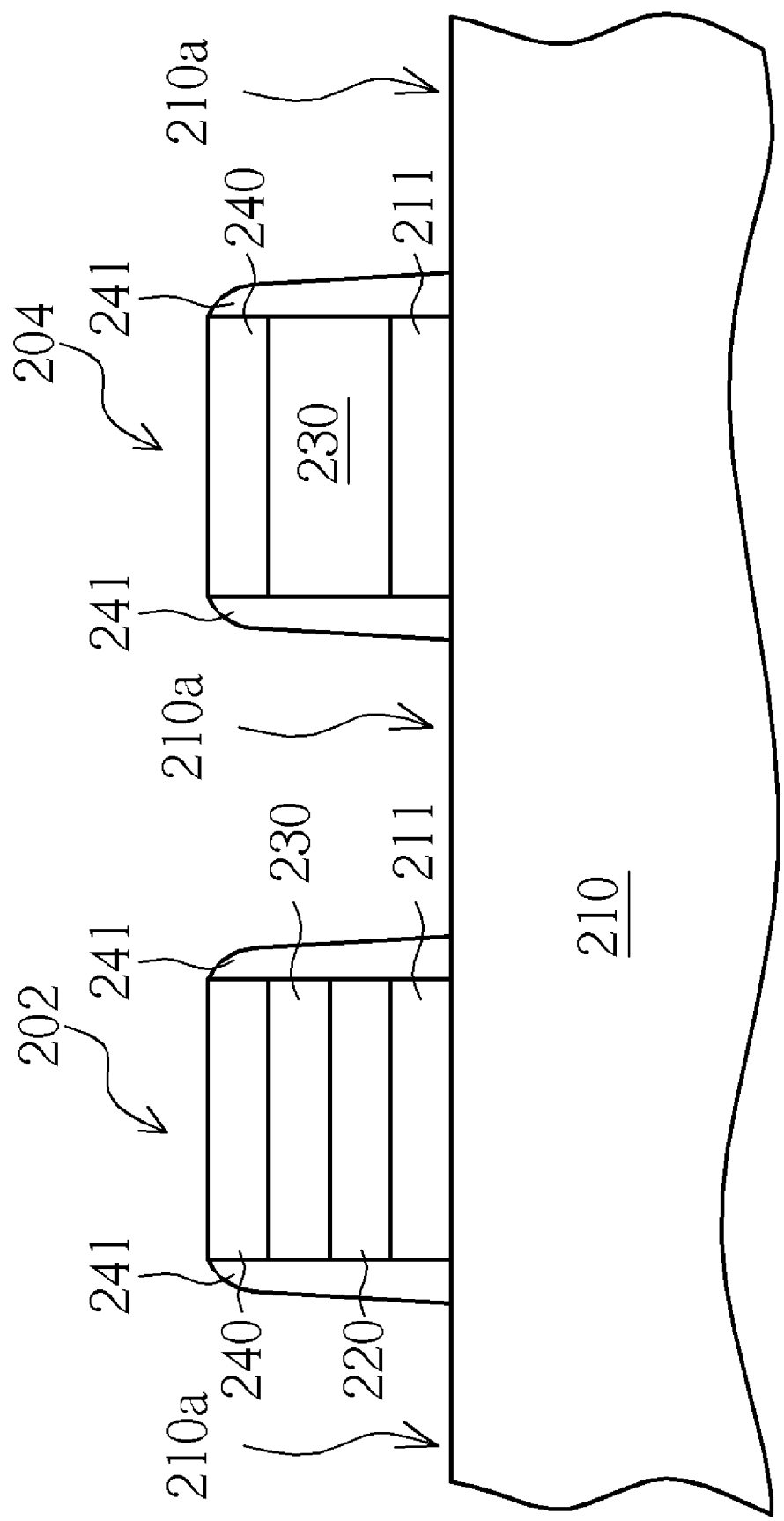

Please refer to FIG. 6. The first gate structure 202 and the second gate structure 204 are about to be completed. For example, in this step the first gate structure 202 and the second gate structure 204 may be modified or an additional part may be introduced, such as sidewalls 241. The completed first gate structure 202 include the barrier layer 240, the silicon layer 230, the lower electrode layer 220 and the oxide layer 211 and the second gate structure 204 includes the barrier layer 240, the oxide layer 211 and the silicon layer 230 directly contacting the oxide layer 211.

Figure 7:
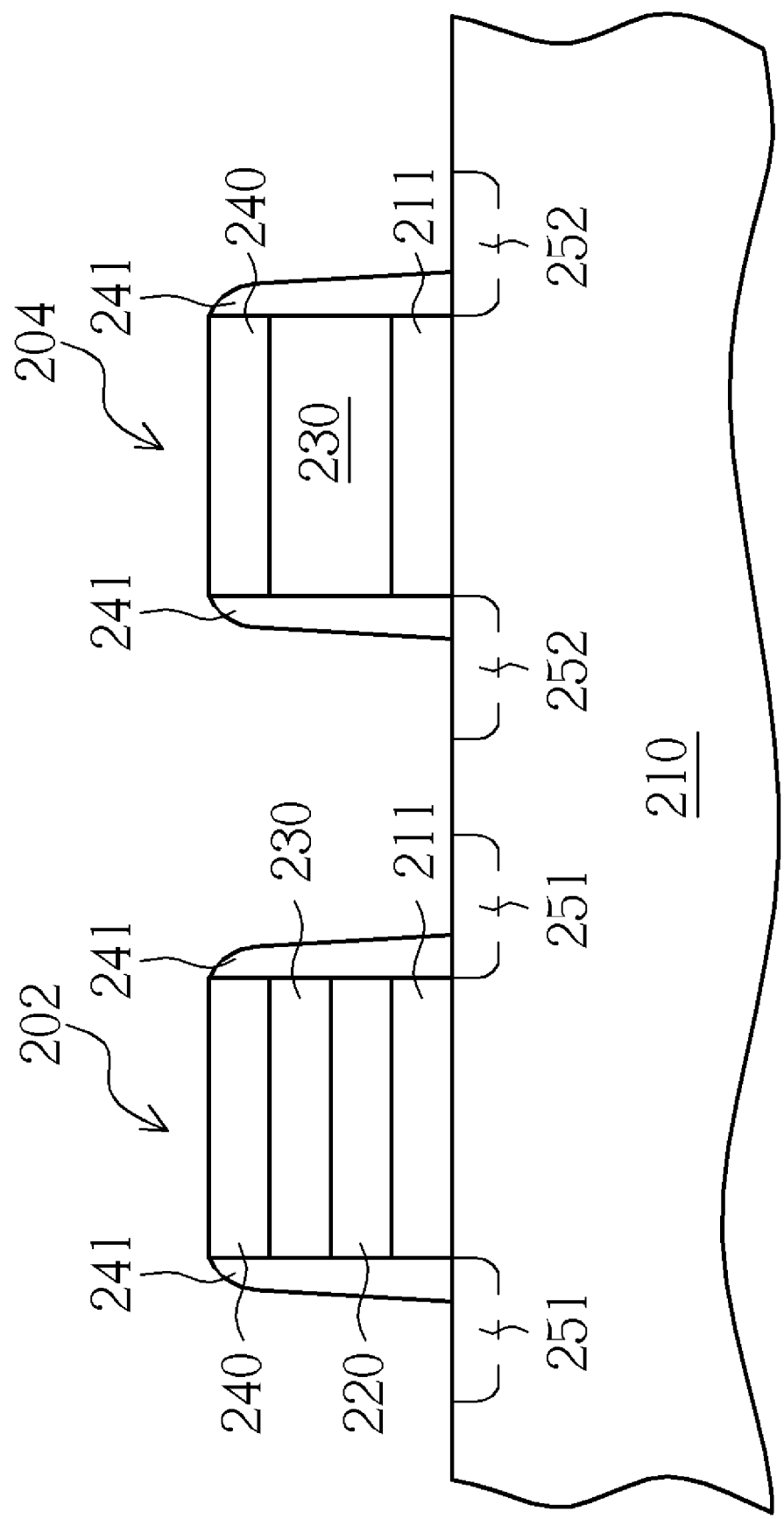

Please refer to FIG. 7. The first source/drain 251 in the proximity of the first gate structure 202 and the second source/drain 252 in the proximity of the second gate structure 204 are formed in the exposed substrate 210a, which can be formed by any suitable method. Preferably, the first source/drain 251 and the second source/drain 252 may independently include a silicide, such cobalt silicide or nickel silicide.

Figure 8:
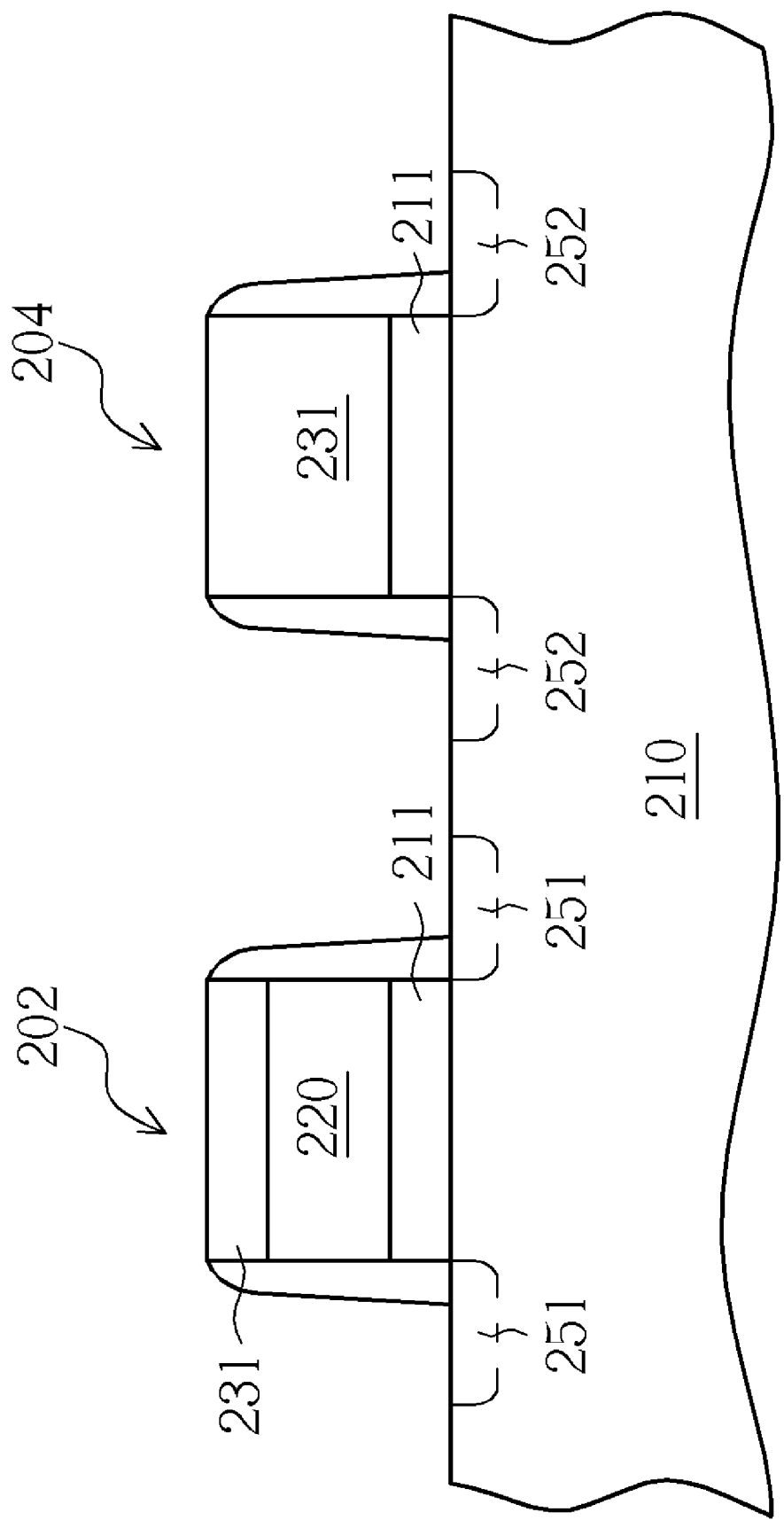

Please refer to FIG. 8. A metal layer may be formed and subsequently the gate electrode 231 can be formed by reacting the silicon layer 230 with the metal layer (FUSI, a fully silicided gate/layer). The metal layer may include Ti, Co, Ni, Pt or Ir, preferably Ni. This step may contain many variations. For example, if the second gate structure 204 is an NMOS, the gate electrode 231 may include a conductive material with a work function higher than that of the substrate 210, a silicide for instance, such as Ni-rich silicide Ni2Si. Or, if the second gate structure 204 is a PMOS, the gate electrode 231 may include a conductive material with a work function smaller than that of the substrate 210, silicide for example, such as Si-rich silicide NiSi2. In addition, since the material of the upper electrode of the first gate structure and the gate electrode of the second gate structure is deposited simultaneously, the material is basically the same. However, an ion Implantation may be performed before the FUSI to adjust the work function of the upper electrode and, in particular, the gate electrode to render the obtained work function of the gate electrode to distinguish from that of the lower electrode. Hence, the ultimate materials of the upper electrode and, in particular, the gate electrode are similar but different.

If necessary, the method of the present invention may further include additional steps. For example, a stress layer (not shown) may be formed in the proximity of the first gate structure 202 and the second gate structure 204. For instance, for NMOS it may include a recess filled with SiC or a tension layer above. For PMOS it may include a recess filled with SiGe or a compression layer above. Alternatively, a lightly doped drain may be firstly formed after the substrate 210a is exposed.

Moreover, the source/drain and an interlayer dielectric layer may be formed before or after the silicon layer 230 reacts with the metal layer. For example, the interlayer dielectric layer (not shown) may be first formed, which covers the first gate structure 202, the first source/drain 251, the second gate structure 204 and the second source/drain 252 and exposes the silicon layer 230 of the first gate structure 202 and the second gate structure 204 respectively. After the gate electrode 231 is formed by reacting the silicon layer 230 with the metal layer (FUSI), the excess metal layer is then removed and a plurality of contact holes are formed in the interlayer dielectric layer so as to expose the first gate structure 202, the first source/drain 251, the second gate structure 204 and the second source/drain 252.

Besides, the process may be adjusted according to the nature of the silicide. For example, if the surfaces of the first source/drain 251 and the second source/drain 252 include cobalt silicide, the barrier layer 240 can be directly removed and the metal layer of nickel silicide is formed, and after the gate electrode 231 is formed by reacting the silicon layer 230 with the metal layer (FUSI), the excess metal layer is then removed and the interlayer dielectric layer is formed, which has a plurality of contact holes exposing the first gate structure 202, the first source/drain 251, the second gate structure 204 and the second source/drain 252. This example is for demonstration only. There are still many other possible variations in addition to this.

In the method of the present invention, only the lower electrode layer is selectively formed. The followed silicon layer may entirely cover the lower electrode layer. In the method of the present invention, it is neither required to selectively etch the lower electrode layer nor to planarize the separately formed lower electrode layer and the silicon layer to the same surface, rather to primarily form a silicide layer made from the silicon layer. Clearly many complicated steps are omitted and this is a simple and easy approach. The advantages of the method reside in that the threshold voltages of each gate structure are determined by ingeniously taking the advantage of the difference of the work function between the silicide formed by the silicon layer and a metal and the lower electrode layer. This is a simple and easy way to form PMOS and NMOS with different threshold voltages and to meet the demand of a more simplified process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:

providing a substrate comprising an oxide layer on its surface;

forming a lower electrode layer on said oxide layer by a deposition, lithography and etching method and exposing said oxide layer selectively;

depositing a silicon layer to cover said lower electrode layer and said oxide layer;

etching said silicon layer, said lower electrode layer and said oxide layer to selectively expose said substrate to form a first gate structure and a second gate structure, wherein said first gate structure comprises said silicon layer, said lower electrode layer and said oxide layer and said second gate structure comprises said oxide layer and said silicon layer directly contacting said oxide layer;

forming a first source/drain in the proximity of said first gate structure and a second source/drain in the proximity of said second gate structure in said exposed substrate; and forming a gate electrode layer by reacting said silicon layers with a metal to form a fully silicide layer as said gate electrode layer after forming said first gate structure and said second gate structure.

2. The method of claim 1, wherein said substrate is selected from the group consisting of silicon, direct-silicon bonding, silicon on insulator, and silicon on insulator direct silicon bonding.

3. The method of claim 1, wherein said lower electrode has a thickness of 10-300 Å.

4. The method of claim 1, wherein said lower electrode has a thickness of 50-100 Å.

5. The method of claim 1, wherein said metal is selected from a group consisting of Ti, Co, Ni, Pt and Ir.

6. The method of claim 1, wherein said metal is Ni.

7. The method of claim 1, wherein said first source/drain and said second source/drain independently comprises a silicide.

8. The method of claim 1, wherein said first gate structure is a P-channel metal-oxide semiconductor gate structure and said second gate structure is an N-channel metal-oxide semiconductor gate structure.

9. The method of claim 8, wherein said lower electrode comprises a conductive material with a work function smaller than that of said substrate.

10. The method of claim 8, wherein said lower electrode comprises titanium nitride.

11. The method of claim 8, wherein said gate electrode comprises a Ni-rich silicide.

12. The method of claim 1, wherein said first gate structure is an N-channel metal-oxide semiconductor gate structure and said second gate structure is a P-channel metal-oxide semiconductor gate structure.

13. The method of claim 12, wherein said lower electrode comprises a conductive material with a work function greater than that of said substrate.

14. The method of claim 12, wherein said lower electrode comprises a group consisting of $MC_x$, $MB_x$, $MC_xN_y$, $MB_xN_y$, and $MB_xC_y$, where M is a metal of (III) group to (VII) group.

15. The method of claim 12, wherein said lower electrode comprises TaC.

16. The method of claim 12, wherein said gate electrode comprises a Si-rich silicide.

17. The method of claim 16, wherein said gate electrode comprises nickel silicide.

18. The method of claim 1, further comprising forming a stress layer in the proximity of said first gate structure and said second gate structure.

19. The method of claim 1, further comprising forming an interlayer dielectric covering said substrate, said first gate structure, said first source/drain, said second gate structure and said second source/drain.

20. The method of claim 19, wherein a plurality of contact holes exposing said first gate structure, said first source/drain, said second gate structure and said second source/drain is formed in said interlayer dielectric.

21. The method of claim 1, wherein an ion Implantation is performed on said gate electrode before said silicon layers reacts with said metal to form said gate electrode layer to adjust the work function of said gate electrode.

22. The method of claim 1, wherein a barrier layer is formed on a silicon layer after a silicon layer is deposited and said barrier layer is removed after the first source/drain and the second source/drain are formed.

* * * * *